United States Patent [19]
Van Der Sluis-Van Der Voort et al.

[11] Patent Number: 5,738,977
[45] Date of Patent: Apr. 14, 1998

[54] METHOD OF PHOTOLITHOGRAPHICALLY PRODUCING A COPPER PATTERN ON A PLATE OF AN ELECTRICALLY INSULATING MATERIAL

[75] Inventors: Elisabeth Van Der Sluis-Van Der Voort; Sigrid M.R. Gelderland, both of Eindhoven, Netherlands

[73] Assignee: U.S. Philips Corporation, New York, N.Y.

[21] Appl. No.: 796,357

[22] Filed: Feb. 7, 1996

Related U.S. Application Data

[63] Continuation of Ser. No. 420,963, Apr. 13, 1995, abandoned.

[30] Foreign Application Priority Data

Apr. 28, 1994 [EP] European Pat. Off. ............ 94201170

[51] Int. Cl.$^6$ ........................................... G03F 7/00
[52] U.S. Cl. ............................ 430/313; 430/318; 427/58; 427/123
[58] Field of Search ........................... 430/311, 313, 430/314, 318; 427/58, 96, 98, 123

[56] References Cited

U.S. PATENT DOCUMENTS

| | | |
|---|---|---|
| 3,240,684 | 3/1966 | Martin. |
| 4,814,205 | 3/1989 | Arcilesi et al. ............ 427/305 |
| 5,235,139 | 8/1993 | Bengston ............ 174/257 |
| 5,474,798 | 12/1995 | Larson ............ 427/58 |

FOREIGN PATENT DOCUMENTS

| | | |
|---|---|---|
| 0464937 | 1/1992 | European Pat. Off. . |
| 0539714 | 5/1993 | European Pat. Off. . |
| 0562670 | 9/1993 | European Pat. Off. . |
| 0577187 | 1/1994 | European Pat. Off. . |
| 3443471 | 1/1987 | Germany . |

*Primary Examiner*—Kathleen Duda
*Attorney, Agent, or Firm*—Robert J. Kraus

[57] ABSTRACT

A method of forming copper patterns on a selection plate for a display, the selection plate having a plurality of holes. The method provides copper patterns that form selected tracks on the selection plate and that are disposed internally of selected holes, the copper patterns being sealed with a corrosion-resistant layer of nickel-phosphorous. The method includes steps of forming a copper layer on at least one surface of the selection plate, forming a layer of nickel-boron on the copper layer, using cataphoretic lithographic processing to form the desired patterns, and providing a nickel-phosphorous layer to seal the patterns.

20 Claims, 1 Drawing Sheet

METHOD OF PHOTOLITHOGRAPHICALLY PRODUCING A COPPER PATTERN ON A PLATE OF AN ELECTRICALLY INSULATING MATERIAL

This is a continuation of application Ser. No. 08/420,963, filed Apr. 13, 1995, now abandoned.

BACKGROUND OF THE INVENTION

The invention relates to a method of photolithographically producing a copper pattern on a plate of an electrically insulating material, said plate comprising holes which are arranged in accordance with a pattern and which are internally provided with a copper layer which is connected to the copper pattern, and a photosensitive cataphoretic lacquer coating being applied.

Such perforated plates, for example, of glass, quartz glass, synthetic resin or a ceramic material are used, in particular, in field-emission displays and thin electron displays, the metallized holes serving as electrodes to control the electron currents moving towards the luminescent screen provided with phosphors and the electron currents in plasma displays. The surface of such a plate also comprises narrow metal tracks which are used to drive (address) the electrodes. In such displays, the plates are used as a control or selection plate. Thin electron displays comprise at least two selection plates.

Such a thin electron display is described in European Patent Application EP-A-464937, filed by Applicants. The display described therein comprises, inter alia, a preselection plate and a fine selection plate. These plates are, for example, made of glass and have a thickness of 0.5 mm. Such a plate comprises a very accurate pattern of holes, for example 300,000 holes having a diameter of 300 µm. In and around said holes there are provided metal selection electrodes which can be individually activated by means of narrow metal tracks on the glass plate. In said Patent Application no information is given as to which metal is used as the electrode nor how the metal is provided in and around the holes.

In European Patent Application EP-A-539714, there is disclosed an electrophoretic method of manufacturing copper patterns on printed circuit boards by using a negative, photosensitive cataphoretic lacquer. A substrate, for example, of epoxy to which a copper layer is uniformly applied is immersed in a solution of such a lacquer, the substrate and an inert electrode, for example, of stainless steel being connected to an external current source. The copper layer on the substrate serves as the cathode and the inert electrode as the anode, i.e. the copper layer is electrically connected to the negative pole of the current source. The solution of the lacquer comprises, inter alia, a mixture of a polymer comprising positively charged groups, unsaturated monomers and a photoinitiator. Examples of positively charged groups are the amino group, quaternary ammonium group, sulphonium group and sulphoxonium group. The electric field in the solution causes the positively charged mixture to be attracted towards the negatively charged copper layer where it is discharged. This results in the formation of a dense and uniform lacquer coating on the copper layer. Such a cataphoretic lacquer must be used to provide three-dimensional copper structures, such as copper tracks in combination with internally metallized holes. The photosensitive lacquer mentioned in said document is of the negative type, i.e. exposed parts of the lacquer coating are cured as a result of a photochemical reaction and hence become less soluble in a developing liquid than unexposed parts. Exposure often takes place through a photomask. Said difference in solubility enables the lacquer coating to be selectively removed. The lacquer pattern formed serves as a mask for an etching agent, so that the copper layer is structured to form a desired pattern which corresponds to the photomask used.

A disadvantage of the use of copper is that this metal is completely oxidized during further processing of the plates into a thin display, said process being carried out in an oxygen-containing atmosphere at temperatures up to approximately 450° C. In addition, copper cannot directly be used as a metal track or electrode in such a thin electron display because of undesirable interactions with the electroluminescent phosphors used.

It is desirable to use copper for the metal tracks of the selection plates because copper has a good electrical conductivity and the metal tracks have a width, for example, of only 80 µm, a thickness of 5 µm and a maximum length, for example, of 40 cm. Consequently, copper can only be used if the copper surface is provided with a sealing, corrosion-resistant layer.

In German Patent document DE-C-3443471 (corresponding to U.S. Pat. No. 4,814,205) a description is given of a method of providing a uniform copper layer with an effective corrosion resistance. To this end, the copper layer is provided, in an electroless process, with a nickel-phosphorous layer (Ni-P) from an aqueous solution of a nickel salt and sodium hypophosphite. It is necessary to previously activate the surface of the copper layer with a solution of at least a noble-metal salt, such as $PdCl_2$, to initiate the electroless deposition of nickel-phosphor on the surface of the copper layer. The disadvantage of this known method is, however, that upon activating tracks of copper, nickel-phosphorous is also deposited between the tracks, which leads to short-circuits. This can possibly be attributed to the roughness of the plates used; the holes in said plates are formed, as will be described hereinafter, by means of powder blasting with abrasive particles. In this case, it is impossible to completely remove $PdCl_2$ from the surface of the plate after the activating treatment by subjecting the plate to a customary water-rinsing treatment.

It would be possible to manufacture a copper pattern which is covered with a corrosion-resistant nickel-phosphorous layer by photolithographically structuring the nickel-phosphor layer and the underlying copper layer. This has the disadvantage, however, that it is very difficult to chemically etch nickel-phosphorous. Nickel-phosphor can only be etched with mixtures of concentrated acids, such as mixtures of phosphoric acid and nitric acid or nitric acid and hydrochloric acid. Under production circumstances such acids are undesirable.

OBJECTS AND SUMMARY OF THE INVENTION

It is an object of the invention to provide, inter alia, a simple and reliable method of providing a nickel-phosphorous layer on a copper pattern of the above-described plates, the walls of the holes also being provided with a copper layer which is coated with a nickel-phosphorous layer, and the above-mentioned disadvantages being overcome.

These objects are achieved by a method as described in the opening paragraph, said method in accordance with the invention comprising the following steps:

providing a copper layer on at least one surface of the plate and on the walls of the holes, providing a nickel-boron layer on the copper layer in an electroless process, cataphoretically providing the photosensitive lacquer coating on the nickel-boron layer, exposing the lacquer coating in accordance with a pattern, thereby forming cured and non-cured portions of the lacquer coating, cured portions being formed at least in the holes, developing the lacquer coating, so that the nickel-boron layer underneath the non-cured potions of the lacquer layer is uncovered, removing the uncovered nickel-boron layer and the underlying copper layer by means of etching, while preserving the nickel-boron layer and copper layer underneath the cured portions of the lacquer coating, stripping the lacquer coating of the cured portions, providing a nickel-phosphorous layer on the nickel-boron layer in an electroless process.

The invention is based on the observation that in order to deposit a nickel-boron layer (Ni-B) from a nickel-boron bath on a copper surface in an electroless process, said surface does not have to be activated with $PdCl_2$. It has also been found that a nickel-phosphorous layer can be deposited without activation on a nickel-boron layer in an electroless process. By virtue thereof, deposition of nickel-boron and/or nickel-phosphorous between the copper tracks on the plate does not take place. In addition, nickel-boron can easily be etched by means of etching agents which are used in the printed circuit board industry, such as $FeCl_3$. In accordance with the invention, the copper layer is first provided with a nickel-boron layer in an electroless process, whereafter a copper pattern covered with a nickel-boron layer is obtained in a photolithographic process. Without being activated, the nickel-boron layer is subsequently covered with a nickel-phosphorous layer in an electroless process.

Apart from a nickel salt, the electroless nickel-boron baths comprise sodium-boron hydride or dimethylaminoborane as the reducing agent. Such baths are commercially available, for example Shipley Niposit 468™. Dependent upon the composition of the bath, less than 0.5 to 5 at. % boron is incorporated in the layer. Such baths often also comprise stabilizers, such as sulphur compounds, tin or lead salts, to preclude spontaneous deposition of nickel.

On account of the price and the dimensional accuracy and stability, the plate is preferably made of glass, but may alternatively be made of a ceramic or synthetic resin material. The thickness of the glass plate is, for example, 0.5 min. The holes can be made in the plate by exposing the plate via a mask to a jet of abrasive powder particles, for example, of aluminium oxide. This method is described in European Patent Application EP-A-562670, filed by Applicants. The holes are, for example, circular in section. Dependent upon the application of the plate, the diameter of the holes ranges from 50 μm to 5 mm. The holes formed are slightly conical, which is advantageous to the subsequent metallization of the holes.

At least one side of the plate is first provided with a copper layer. In this process, also the walls of the holes are provided with a copper latter. The copper layer can advantageously be provided by vacuum evaporation or sputtering, the surface of the plate having the largest diameter of the conical holes facing the evaporation source or Sputter target. This results in said surface of the plate and the walls of the holes being coated with a copper layer. The thickness of the copper layer is, for example, 3 μm. For certain applications, both sides of the plate are copper-plated.

The copper layer can alternatively be provided on the plate from an electroless copper bath. This means that all metallizations, i.e. the copper plating and the subsequent nickel-plating, are obtained in a wet-chemical process and hence do not require expensive vacuum equipment. Such a copper bath comprises an aqueous solution of a copper salt, a reducing agent such as formaline and a complexing agent such as EDTA. Such electroless copper baths are commercially available, for example Shipley Cuposit 78™ and Cuposit 251™. The plate to be metallized is previously nucleated (termed activation) in known manner by bringing said plate into contact with either aqueous solutions of, in succession, $SnCl_2$ and $PdCl_2$ or with a colloidal SnPd dispersion. A very effective nucleation of a glass plate is obtained when the plate is provided with a monolayer of an alkoxyaminosilane, whereafter said plate is brought into contact with an aqueous Pd sol which is stabilized with polyvinyl alcohol (PVA) or polyvinyl pyrrolidone (PVP). The latter method is described in European Patent Application EP-A-577187, filed by Applicants, and yields a very reliably activated plate surface.

The copper layer can be deposited in the desired thickness, for example 3 μm, from the electroless copper bath. It is alternatively possible to deposit a relatively thin copper layer, for example, of 200 nm from an electroless copper bath, which layer is subsequently reinforced in an electroplating copper bath until the desired layer thickness is attained. The latter bath does not comprise a reducing agent; the copper ions are reduced at the copper surface by means of an external current source. Electrodeposition of copper enables the ultimate layer thickness to be attained more rapidly.

The copper-plated plate is subsequently covered entirely with a nickel-boron layer from an electroless nickel-boron bath, as described hereinabove. The layer thickness of the nickel-boron bath, for example, is 200 nm. In this case, the copper layer does not have to be activated with $PdCl_2$. If the copper layer has been exposed to air for a relatively long period of time, it may be necessary to immerse the copper layer in an aqueous solution of hydrochloric acid in a concentration of 0.1 mol/l for several seconds to remove oxide.

The plate is subsequently immersed in a bath comprising a photosensitive, cataphoretic lacquer. Such lacquers often are of the negative type, i.e. the lacquer cures under the influence of light. Said lacquers are commercially available and generally comprise a solvent, a polymer with positively charged groups, a photoinitiator and unsaturated monomers. Such a lacquer is described in the above-mentioned European Patent Application EP-A-539714. The lacquer described therein is composed, for example, of an aqueous solution of a polyaminoacrylate, diethoxy acetophenone as the photoinitiator and butyl methacrylate monomers. The plate to which the copper and nickel-boron layers are applied is galvanically connected to the negative pole of an external current source and serves as the cathode. The bath also comprises a plate or rod of an inert material, such as platinum or stainless steel, which serves as the anode and which is connected to the positive pole of the current source. A DC voltage, for example, of 100 V is applied across the cathode and the anode. After a short period of, for example, thirty seconds a photosensitive lacquer layer is deposited on the nickel-boron layer. The plate is subsequently removed from the bath, rinsed with water and dried. Cataphoretic provision of the lacquer layer ensures that said layer is provided in a uniform thickness on the entire plate and on the walls of the holes. To preclude a sticky surface, the lacquer layer may optionally be provided with a top coating. For this purpose, use can be made of coating solutions specified by the supplier of the cataphoretic lacquer, for example solutions on the basis of hydroxy cellulose. By virtue of such a top coating, it is precluded, inter alia, that the lacquer layer sticks to the photomask in the subsequent exposure step.

Owing to the presence of unsaturated monomers, the composition of the cataphoretic lacquer is such that exposure to actinic radiation results in the formation of a crosslinked network of polymers. As there is a large choice of UV-sensitive photoinitiators and exposure means, such as UV-lamps and masks, use is preferably made of UV-light, for example originating from a mercury-vapour lamp emitting light having a wavelength of 365 nm, for exposure of the lacquer coating in accordance with a pattern.

Patterned exposure preferably takes place through a photomask, which is provided on the lacquer coating. In this case, the lacquer coating is preferably provided with the above-mentioned top coating to preclude sticking of the photomask to the lacquer coating. The photomask may optionally be placed at a short distance from the lacquer coating. By virtue thereof, damage to the photomask and/or the lacquer coating as well as undesired adhesion of the photomask to the sticky lacquer coating are precluded, however, the resolution is adversely affected. The photomask used only transmits UV-light in those places where the metal tracks are to be provided on the surface of the plate and where the metal electrodes are to be provided in the holes. Preferably, a narrow edge around the holes is also exposed because of the ultimately desired electrode shape.

After exposure, the lacquer coating is developed by means of a developing liquid. For this purpose, use is often made of an aqueous alkaline solution of NaOH or $Na_2CO_3$, an aqueous lactic acid solution or a developing agent specified by the supplier of the photosensitive cataphoretic lacquer. In this process, the non-cured potions of the lacquer coating are removed and the underlying nickel-boron layer is uncovered. Following said developing process, the plate is rinsed with water.

The uncovered nickel-boron layer and the underlying copper layer are removed by means of well-known etching agents for these metals. A suitable etching agent is, for example, an aqueous solution of $FeCl_3$ and hydrochloric acid. The plate is subsequently rinsed with water.

The cured portions of the lacquer coating are subsequently stripped. For this purpose, use can be made of an alkaline solution as specified by the supplier of the cataphoretic lacquer. The lacquer can also be stripped by means of an oxygen plasma.

At this stage, the plate comprises a copper pattern and the walls of the holes in the plate are copper-clad. The copper surface of the copper pattern and of the copper layer in the holes is covered with a nickel-boron layer.

Said nickel-boron layer is subsequently coated with a nickel-phosphorous layer from an electroless nickel-phosphorous bath. This takes place without activating the nickel-boron layer. Such a nickel-phosphor bath comprises sodium hypophosphite as the reducing agent. Said baths are commercially available, for example Shipley Niposit 65™ and OMI Enlyte 310™. The phosphorous content in the layer is approximately 10 at. % and is governed by the composition of the bath. The thickness of the nickel-phosphorous layer is, for example, 500 nm. Owing to the absence of an activating treatment, deposition of nickel on the plate surface between the copper pattern does not occur, and hence a short-circuit between the copper tracks is precluded. As described hereinabove, nickel-phosphorous cannot be deposited on a copper pattern without an activating treatment. This problem is overcome by applying, in accordance with the invention, an intermediate layer of nickel-boron.

The plate is subsequently rinsed in water and dried. At this stage, the plate has been provided with copper tracks and electrodes of copper have been formed on the walls of the holes. The copper surface has been provided with a corrosion-resistant nickel-phosphorous layer, so that the plates can be further processed to form a display at temperatures of approximately 450° C. By virtue of the sealing nickel-phosphorous layer the copper no longer causes undesired interactions with the electroluminescent phosphors of the display.

BRIEF DESCRIPTION OF THE DRAWINGS

The invention will be explained in greater detail by means of an exemplary embodiment and a drawing, in which.

DESCRIPTION OF THE PREFERRED EMBODIMENTS

Figure 1A:
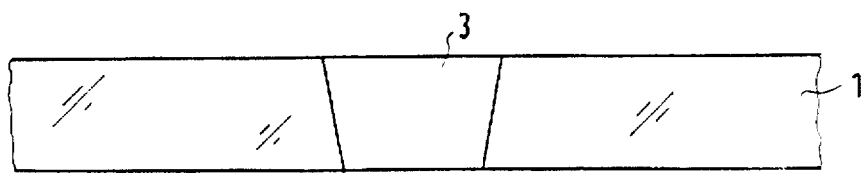
FIGS. 1A to 1G are schematic cross-sectional views of a plate, illustrating the different stages of the method in accordance with the invention.

In the schematic Figures to be considered hereinafter, the dimensions, such as the layer thicknesses, are not drawn to scale. In FIG. 1A, reference numeral 1 denotes a part of a cross-section of a glass plate. Said plate has dimensions of 27×44 cm and a thickness of 0.4 mm. By subjecting the plate to a jet of aluminium-oxide powder, 300.000 conical, circular holes 3 having a maximum diameter of 300 μm and a minimum diameter of 100 μm are formed in said plate. The manner in which said holes are formed is described in the above-mentioned European Patent Application EP-A-562670. To remove any small aluminium-oxide particles, the plate is immersed in an aqueous solution of 2% HF for 2 minutes. The plate is subsequently rinsed with water and dried.

Figure 1B:
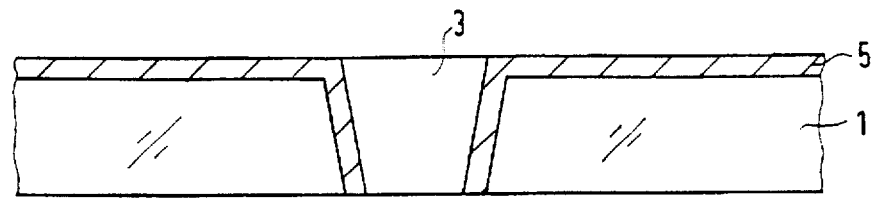

In a vapour deposition system, the plate is provided with a copper layer 5 (FIG. 1B) having a thickness of 3 μm. In this example, only one side of the plate is coated with a copper layer 5 and by virtue of the conical shape, also the walls of the holes 3 are internally provided with a copper layer.

The plate is subsequently immersed in an electroless nickel-boron bath of the following composition:

| | |
|---|---|
| $NiSO_4.6H_2O$ | 30 g/l |
| dimethyl aminoborane | 3.5 g/l |
| glycine | 18 g/l |
| malonic acid | 27 g/l |
| ammonia up to pH = 7.0. | |

Figure 1C:
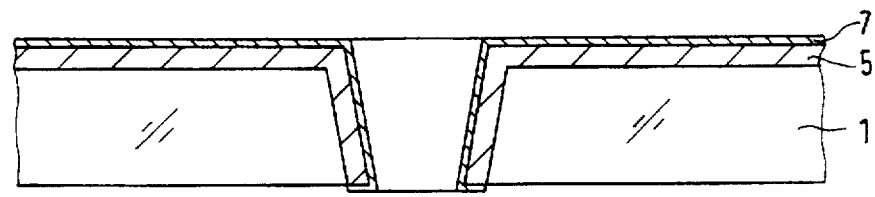

The temperature of the bath is 70° C. Without activating the copper layer 5, a 200 nm thick layer 7 of nickel comprising 0.2 at. % boron is deposited on this layer (FIG. 1C). The plate is subsequently rinsed with water.

Figure 1D:
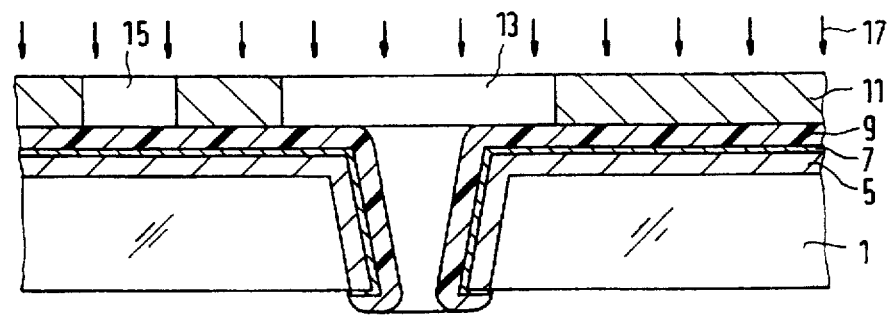

The plate is subsequently immersed in EAGLE™ negative, photosensitive cataphoretic lacquer (sold by Shipley Company Inc.) dissolved in water. The lacquer comprises an organic polymer with alkaline amino groups which are neutralized by a water-soluble organic carboxylic acid, thereby forming a stable micro-emulsion comprising micelles having dimensions of 100 nm. Said micelles are positively charged and are stabilized by an electrical double layer. The temperature of the lacquer is 35° C. The nickel-boron layer 7 is used as the cathode and a plate of stainless steel is used as the anode. A DC voltage of 100 V is applied between the anode and the cathode. Initially, the current intensity is 2 A. The positively charged micelles migrate towards the cathode. At the cathode, electrolysis of water takes place, resulting in the formation of hydrogen and hydroxy ions. As a result of the alkaline medium formed, the charge on the micelles is neutralized, causing said micelles to coalesce into a layer on the cathode. The organic layer formed is electrically insulating, so that the current through the bath decreases to substantially zero with time. The plate is rinsed with water and dried at 45° C. A lacquer coating 9 (FIG. 1D) having a thickness of 25 µm has then been formed on the nickel-boron layer 7. By virtue of the cataphoretic process, the lacquer coating 9 is deposited in a uniform thickness on the plate and in the holes. Said lacquer coating 9 may optionally be provided with a top coating (not shown) by immersing the plate in an aqueous EAGLE™ 2002 (Shipley Company Inc.) solution. This solution comprises cellulose. By virtue thereof, the stickiness of the lacquer coating is reduced. The plate is subsequently dried at 45° C. and baked at 80° C. for 10 minutes.

A photomask 11 (FIG. 1E), such as a glass plate provided with a chromium or $Fe_2O_3$ pattern, is placed on the lacquer mating 9. Said photomask comprises transparent portions 13 which are slightly larger than the holes 3 and transparent portions 15 which coincide with the portions of the copper layer to be provided with copper tracks. Arrows 17 denote UV-light originating from a mercury-vapour lamp. This lamp emits light having a wavelength of 465 nm. The exposure dose is 2000 mJ/cm². In the exposed areas of the lacquer coating 9 a cured, cross-linked polymer is formed which is slightly soluble in a developing liquid.

Figure 1E:
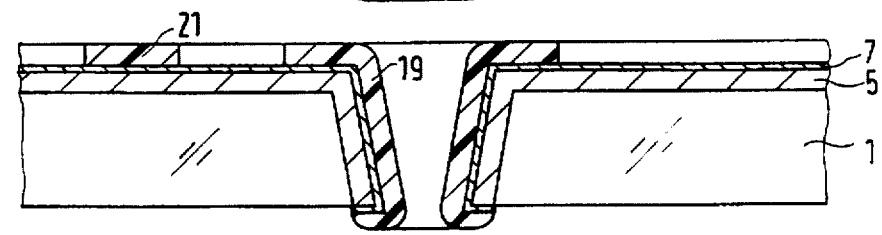

The exposed lacquer coating 9 is developed by immersing it in an aqueous solution of EAGLE™ DEVELOPER 2005 (Shipley Company Inc.) on the basis of lactic acid, whereafter it is rinsed with water and dried. The unexposed potions of the lacquer mating are removed from the nickel-boron layer 7. A lacquer coating 19 remains on the nickel-boron layer in and around the holes (FIG. 1E). A lacquer coating 21 also remains in places where conductive copper tracks are to be provided.

The uncovered nickel-boron layer and the underlying copper layer are etched in an aqueous solution comprising 400 g $FeCl_3$ and 1 mol HCl per liter.

Figure 1F:
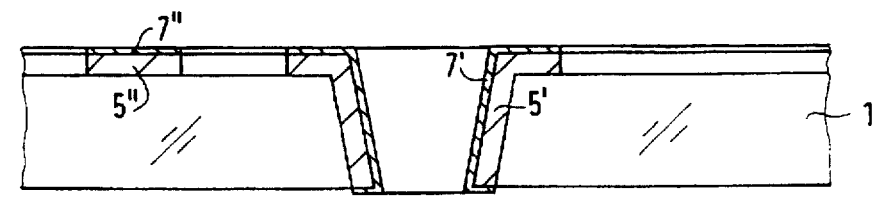

The exposed lacquer coating is removed by immersing the plate in EAGLE™ REMOVER 2009 (Shipley Company Inc.), whereafter the plate is rinsed in water (FIG. 1F). The glass plate now comprises holes whose walls are provided with a copper layer 5' which is covered with a nickel-boron layer 7'. The plate comprises copper tracks 5" which are covered with a nickel-boron layer 7".

The plate is subsequently immersed in an electroless nickel-phosphorous bath of the following composition:

| | |
|---|---|
| $NiCl_2.6H_2O$ | 26 g/l |
| sodium hypophosphite | 24 g/l |
| lactic acid | 27 g/l |
| propionic acid | 2.2 g/l |
| lead acetate | 0.002 g/l |
| NaOH up to pH = 4.6. | |

Figure 1G:
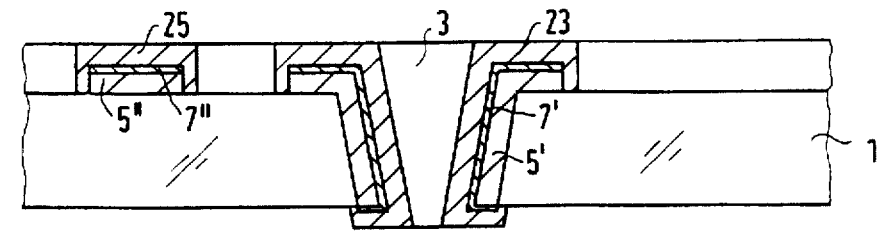

The temperature of the bath is 95° C. Without activation of the nickel-boron layer 7', 7", a 500 nm thick layer 23, 25 of nickel-phosphorous is deposited on this layer (FIG. 1G). The plate is subsequently rinsed with water. At this stage, the glass plate comprises holes which are covered with copper electrodes 5'. The surface of the copper electrode 5' and of the copper tracks 5" is provided with, respectively, corrosion-resistant nickel-phosphor layers 23 and 25.

By means of the method in accordance with the invention, an electrically insulating substrate having many holes is provided in a simple manner with well-conducting copper tracks on the plate and copper electrodes in the holes. The copper surface is provided with a corrosion-resistant nickel-phosphorous layer in a reliable manner. The method can very suitably be used for the manufacture of selection plates and control plates for plasma displays, field-emission displays and thin electron displays.

We claim:

1. A method for producing a selection plate for a display, the selection plate comprising a glass electrically insulating substrate having at least a first surface provided with a pattern of tracks, the insulating substrate comprising at least one hole having an internal surface and having metallization, the tracks and the metallization comprising copper, the method comprising the consecutive steps of:
   a) providing a copper layer on the first surface of the substrate and at least on the internal surface of the hole;
   b) providing the copper layer with a nickel-boron layer;
   c) cataphoretically providing a photosensitive lacquer coating on the nickel-boron layer;
   d) exposing and developing the lacquer coating to remove a portion of the lacquer coating, so as to uncover a portion of the nickel-boron layer, the uncovered portion having associated therewith a portion of the copper layer;
   e) removing the uncovered portion of the nickel-boron layer, and removing the portion of the copper layer associated therewith, so as to form a pattern of tracks on the first surface of the substrate and to form the metallization of the hole, the pattern and the metallization comprising nickel-boron from the nickel-boron layer and copper from the copper layer;
   f) stripping the remaining lacquer coating; and
   g) providing a nickel-phosphorous layer to cover the nickel-boron of the pattern of tracks of the first surface of the substrate and the metallization of the hole.

2. A method as claimed in claim 1, characterized in that the copper layer is provided from an electroless copper bath.

3. A method as claimed in claim 1, characterized in that the copper layer is provided by vacuum evaporation or sputtering.

4. A method as claimed in claim 1, characterized in that a negative, UV-sensitive cataphoretic lacquer coating is applied.

5. The method of claim 1, wherein the exposing and developing step comprises selectively exposing the lacquer coating to form cured and non-cured portions thereof, the cured portions associated with the hole and the pattern of tracks to be formed.

6. The method of claim 5, wherein the exposing and developing step comprises, subsequent to selectively exposing the lacquer coating, developing the lacquer coating to remove the non-cured portions of the lacquer coating, so as to uncover portions of the nickel-boron layer for removal in the removing step.

7. The method of claim 1, wherein the hole comprises an entrance defined by an edge of the first surface of the substrate around to the hole, the steps "a" through "g" providing for the entrance to have associated sealed metallization.

8. The method of claim 7, wherein the substrate comprises a second surface disposed opposite the first surface, the hole extends through the substrate from the first surface to the second surface and the hole comprises an exit defined by an edge of the second surface of the substrate around the hole, the steps "a" through "g" providing for the hole to have associated sealed metallization from the entrance to the exit and including the internal surface.

9. The method of claim 1, wherein the nickel-boron layer is provided using an electroless process.

10. The method of claim 1, wherein the removing step comprises etching.

11. A method for producing a selection plate for a display, the selection plate comprising a glass electrically insulating substrate having at least a first surface provided with a pattern of metallization, the metallization having a sidewall extending away from the first surface of the substrate, the metallization comprising copper, the method comprising the consecutive steps of:

a) providing a copper layer on the surface of the substrate;
   b) providing the copper layer with a nickel-boron layer;
   c) cataphoretically providing a photosensitive lacquer coating on the nickel-boron layer;
   d) selectively exposing and developing the lacquer coating to remove a portion of the lacquer coating, so as to uncover a portion of the nickel-boron layer, the uncovered portion having associated therewith a portion of the copper layer;
   e) removing the uncovered portion of the nickel-boron layer, and removing the portion of the copper layer, so as to form a pattern of metallization on the substrate comprising nickel-boron from the nickel-boron layer and copper from the copper layer;
   f) stripping the remaining lacquer coating;
   g) providing a nickel-phosphorous layer in association with the nickel-boron of the pattern of metallization.

12. A method of manufacturing a control plate for a display, the control plate comprising a glass substrate having at least a first surface provided with a pattern of tracks, the substrate comprising a plurality of holes having internal surfaces and having metallization, the tracks and the metallization comprising copper, the method comprising the consecutive steps of:

a) providing the glass substrate;
   b) subjecting the substrate to a powder blasting treatment with abrasive particles to form the holes in the substrate;
   c) providing a copper layer on the first surface of the substrate and at least on the internal surfaces of the holes;
   d) providing the copper layer with a nickel-boron layer;
   e) cataphoretically providing a photosensitive lacquer coating on the nickel-boron layer;
   f) exposing and developing the lacquer coating to remove a portion of the lacquer coating, so as to uncover a portion of the nickel-boron layer, the uncovered portion having associated therewith a portion of the copper layer;
   g) removing the uncovered portion of the nickel-boron layer, and removing the portion of the copper layer associated therewith, so as to form a pattern of tracks on the first surface of the substrate and to form the metallization of the hole, the pattern and the metallization comprising nickel-boron from the nickel-boron layer and copper from the copper layer;
   h) stripping the remaining lacquer coating; and
   I) providing a nickel-phosphorous layer on the nickel-boron of the pattern of tracks of the first surface of the substrate and the metallization of the holes.

13. A method of producing a control plate for a display, comprising an electrically insulating substrate having metallized through-holes and connected metal tracks, which method comprises the consecutive steps of:

providing a glass plate as a substrate;
   forming through-holes in the substrate;
   depositing a copper layer on at least one surface of the substrate and the walls of the through-holes;
   depositing a nickel-boron layer on the copper layer;
   cataphoretically depositing a photosensitive lacquer coating on the nickel-boron layer;
   patternwise exposing the lacquer coating with actinic radiation in accordance with desired metal tracks, thereby forming cured and non-cured portions of the lacquer coating, cured portions being formed coinciding with the desired metal tracks and in the through-holes;
   developing the lacquer coating to remove the non-cured portions of the lacquer coating to reveal portions of the nickel-boron layer;
   etching to remove the revealed portions of the nickel-boron layer and portions of the copper layer underlying the revealed portions of the nickel-boron layer, thereby forming metal tracks;
   stripping to remove the cured portions of the lacquer coating from remaining portions of the nickel-boron layer on the metal tracks and on the walls of the through-holes; and then
   depositing an electroless nickel-phosphorous layer on the remaining portions of the nickel-boron layer.

14. The method of claim 13 wherein the nickel-boron layer is deposited from an electroless nickel-boron bath.

15. The method of claim 13 wherein the control plate is a selection plate for a thin electron display.

16. The method of claim 13 wherein the control plate is for a field-emission display.

17. The method of claim 13 wherein the control plate is for a plasma display.

18. The method of claim 13 wherein the copper layer is deposited from an electroless copper bath.

19. The method of claim 13 wherein the copper layer is deposited by vacuum evaporation.

20. The method of claim 13 wherein the copper layer is deposited by sputtering.

* * * * *